United States Patent
Tada et al.

(10) Patent No.: US 8,113,816 B2
(45) Date of Patent: Feb. 14, 2012

(54) IMPRINT DEVICE AND IMPRINT METHOD

(75) Inventors: Yasuhiko Tada, Ibaraki (JP); Masahiko Ogino, Ibaraki (JP); Hiroshi Yoshida, Ibaraki (JP); Takashi Ando, Ibaraki (JP); Kosuke Kuwabara, Ibaraki (JP)

(73) Assignee: Hitachi High-Technologies Corporation, Tokyo (JP)

( * ) Notice: Subject to any disclaimer, the term of this patent is extended or adjusted under 35 U.S.C. 154(b) by 246 days.

(21) Appl. No.: 11/774,266

(22) Filed: Jul. 6, 2007

(65) Prior Publication Data

US 2008/0029931 A1  Feb. 7, 2008

(30) Foreign Application Priority Data

Jul. 7, 2006 (JP) ................................ 2006-188383

(51) Int. Cl.
*B28B 13/06* (2006.01)

(52) U.S. Cl. ........ 425/444; 264/334; 264/239; 264/299; 425/385; 425/438

(58) Field of Classification Search .................. 264/293, 264/239, 241, 248, 249, 294, 299, 313, 106, 264/107, 273, 274, 334, 336, 316, 295; 425/457, 425/406, 409, 412, 414, 444, 385, 438
See application file for complete search history.

(56) References Cited

U.S. PATENT DOCUMENTS

| | | | |
|---|---|---|---|
| 4,961,884 A * | 10/1990 | Watanabe et al. | 264/106 |
| 6,870,301 B2 | 3/2005 | Choi et al. | |
| 7,363,854 B2 * | 4/2008 | Sewell | 101/41 |
| 2007/0092594 A1 | 4/2007 | Ho et al. | |

FOREIGN PATENT DOCUMENTS

| | | | |
|---|---|---|---|
| JP | 06-000876 | | 1/1994 |
| JP | 09167385 A | * | 6/1997 |
| JP | 2001-1172788 | * | 6/2001 |
| JP | 2005-038596 | | 2/2005 |
| JP | 2007-118552 | | 5/2007 |

OTHER PUBLICATIONS

JP 09-167385 (Machine Translation) [online], [retrieved on Aug. 24, 2009], retrieved from PAJ Database (http://www19.ipdl.inpit.go.jp/PA1/cgi-bin/PA1INDEX).*
JP 2001-1172788 (Machine Translation) [online], [retrieved on Jun. 1, 2010], retrieved from PAJ Database (http://www19.ipdl.inpit.go.jp/PA1/cgi-bin/PA1INDEX).*
Office Action in JP 2006-188383, dated Mar. 23, 2011; [4 pgs., in Japanese].

* cited by examiner

*Primary Examiner* — Matthew Daniels
*Assistant Examiner* — Yana Belyaev
(74) *Attorney, Agent, or Firm* — Antonelli, Terry, Stout & Kraus, LLP.

(57) ABSTRACT

An imprint device transfers a finely patterned structure created on a stamper onto a material to be patterned, by bringing the stamper and the material to be patterned in contact with each other. At least one chamfered edge portion is formed at least one of the stamper and the material to be patterned. The imprint device has a separating unit for holding the chamfered edge portion of at least one of the stamper and the material to be patterned, so as to separate the stamper from the material to be patterned.

21 Claims, 13 Drawing Sheets

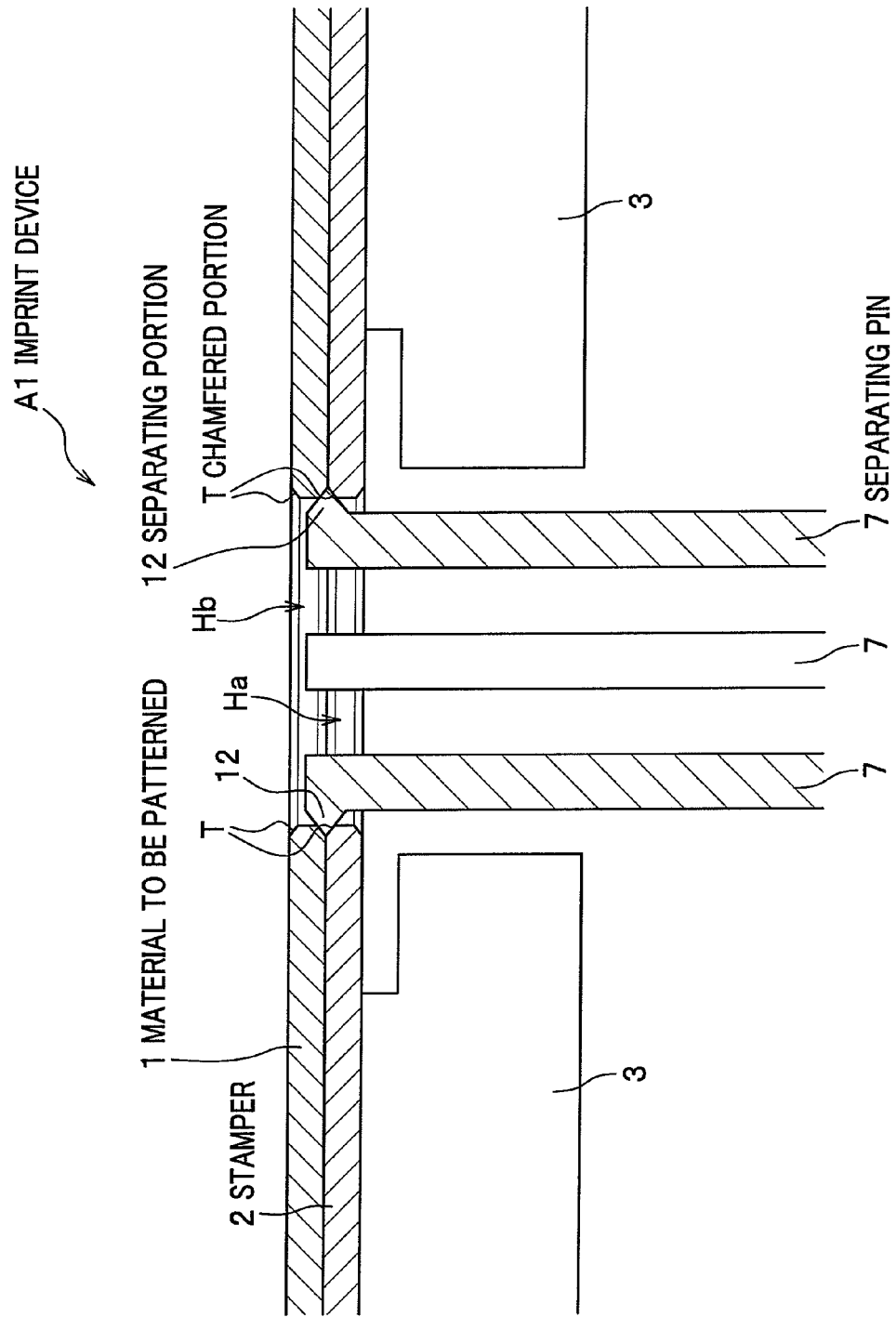

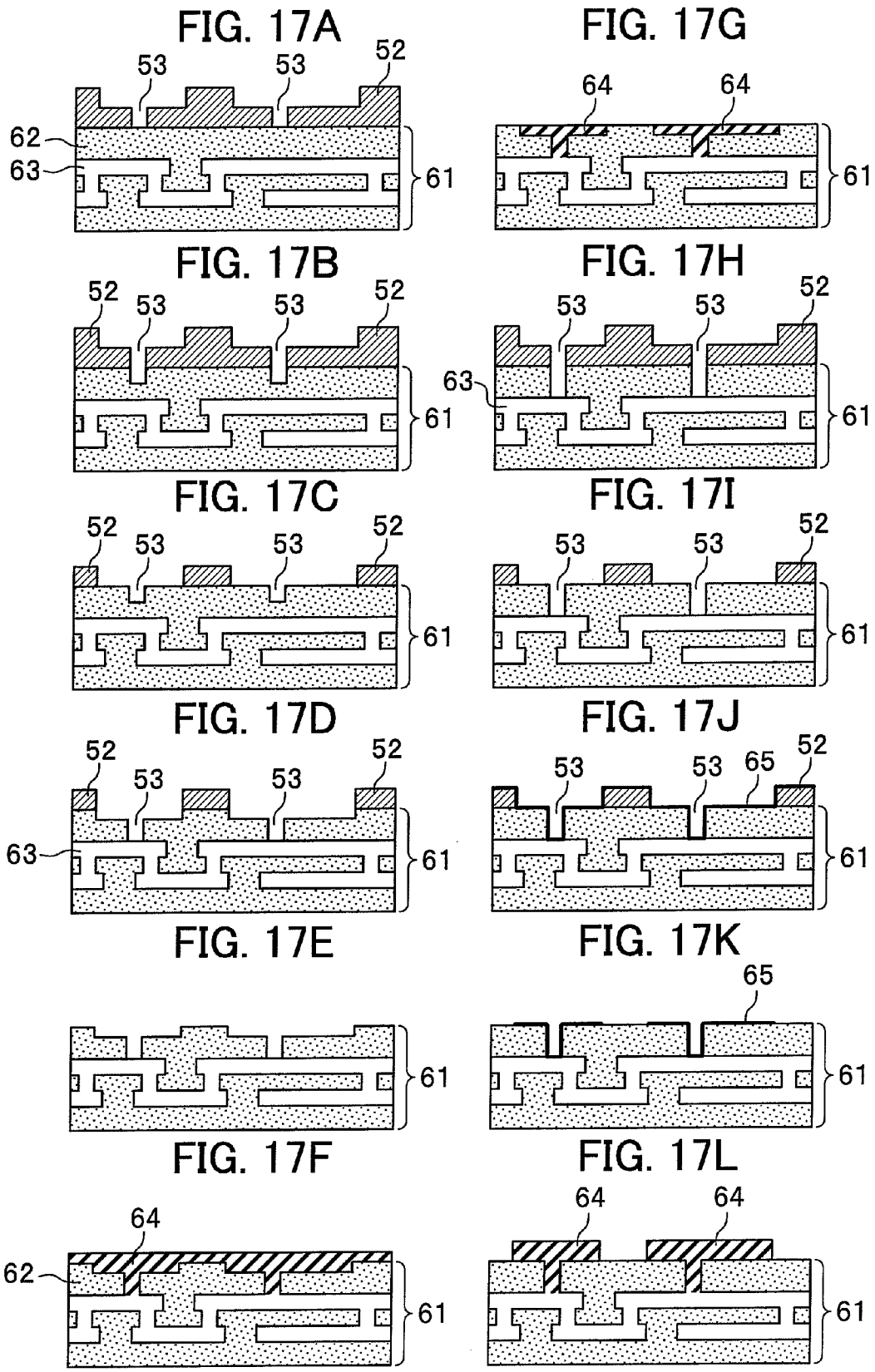

IMPRINT DEVICE AND IMPRINT METHOD

CROSS REFERENCE TO RELATED APPLICATIONS

This application claims the benefit of Japanese Patent Application No. 2006-188383 filed on Jul. 7, 2006, the disclosure of which is incorporated herein by reference.

BACKGROUND OF THE INVENTION

1. Field of the Invention

The present invention relates to an imprint device for transferring a finely patterned structure created on a surface of a stamper to a surface of a material to be patterned, and an imprint method.

2. Description of the Related Art

Development of information technology in recent years requires further development of associated technologies in such fields as networks, software and devices. A high-level technology is required, in particular, in fabricating semiconductor integrated circuits, which have been made extremely smaller and even more integrated so as to obtain performance at higher speed with lower power consumption.

Photolithography technology for microfabricating semiconductor integrated circuits has recently shifted from KrF laser lithography with a minimum line width of 130 nm to ArF laser lithography with the width of 100 nm, thus the latter achieving a resolution higher than the former. However, even ArF laser lithography is not sufficient to be used in microfabricating a 45 nm-sized device, which is to be started as early as in 2007. Under such circumstances, promising photolithographic technologies for further higher-level microfabrication may include F2 laser lithography, extreme ultraviolet lithography, electron beam lithography, and X-ray lithography. Nevertheless, development of microfabrication brings about such problems that an initial cost of exposure equipment has been exponentially increased, and that a price of a mask to achieve a resolution equal or near to a wavelength of a light used in the microfabrication has sharply risen.

Imprint lithography has also been developed for creating a finely patterned structure. In imprint lithography, a stamper having a fine pattern complementary to a desired one is stamped onto a surface of a material to be patterned, to thereby transfer the desired fine pattern thereon. The stamper is then separated from the material to be patterned. Imprint lithography can transfer a microstructure at a 25 nm scale or less with low cost. Imprint lithography has also been applied to creation of recording bits for a large capacity recording medium, and of a pattern of a semiconductor integrated circuit.

In imprint lithography, after a stamper is used for transferring a fine pattern onto a material to be patterned such as a large capacity recording medium and a semiconductor integrated circuit, the stamper has to be separated from the material to be patterned (To simplify descriptions, even after a pattern is transferred on a material to be patterned, the material to be patterned is still referred to as the "material to be transferred" hereinafter). It is difficult, however, to separate the stamper in a vertical direction from the material to be patterned, because the stamper and the material to be patterned have been vacuum-adsorbed with each other for successfully transferring the fine pattern. To separate them, a gap needs to be created therebetween to cause a vacuum break. For example, U.S. Pat. No. 6,870,301 discloses a technique in which a stamper or a material to be patterned is tilted to induce a gap therebetween, and then, a part opposite to the gap is lifted to separate them.

In imprint lithography, however, when a microstructure in a nanometer order, for example, a microstructure created on a disk substrate for a magnetic recording medium is transferred onto a material to be patterned, there is a problem that the microstructure is too small to be successfully separated from the stamper without deformation.

SUMMARY OF THE INVENTION

According to an aspect of the present invention, an imprint device is provided for transferring a finely patterned structure created on a stamper onto a material to be patterned by bringing the stamper and the material to be patterned in contact with each other. At least one chamfered edge portion is formed at least one of the stamper and the material to be patterned. The imprint device also has a separating unit for holding the at least one chamfered edge portion, so as to separate the stamper from the material to be patterned.

According to another aspect of the present invention, an imprint method is provided for transferring a finely patterned structure created on a stamper onto a material to be patterned. In the imprint method, at least one chamfered edge portion is formed at least one of the stamper and the material to be patterned. The imprint method includes a contacting step of bringing the stamper and the material to be patterned in contact with each other; and a separating step of holding the at least one chamfered portion of at least one of the stamper and the material to be patterned, and separating the stamper and the material to be patterned.

Other features and advantages of the present invention will become more apparent from the following detailed description of the invention, when taken in conjunction with the accompanying exemplary drawings.

BRIEF DESCRIPTION OF THE DRAWINGS

FIG. 3 is a partially enlarged cross sectional view showing chamfered portions of the material to be patterned and the stamper according to the embodiment.

FIG. 17A to FIG. 17L are views for explaining a method of manufacturing a multilayer wiring substrate according to a ninth example.

DETAILED DESCRIPTION OF THE EXEMPLARY EMBODIMENT

With reference to related drawings, an embodiment of the present invention is described in detail.

Figure 1:
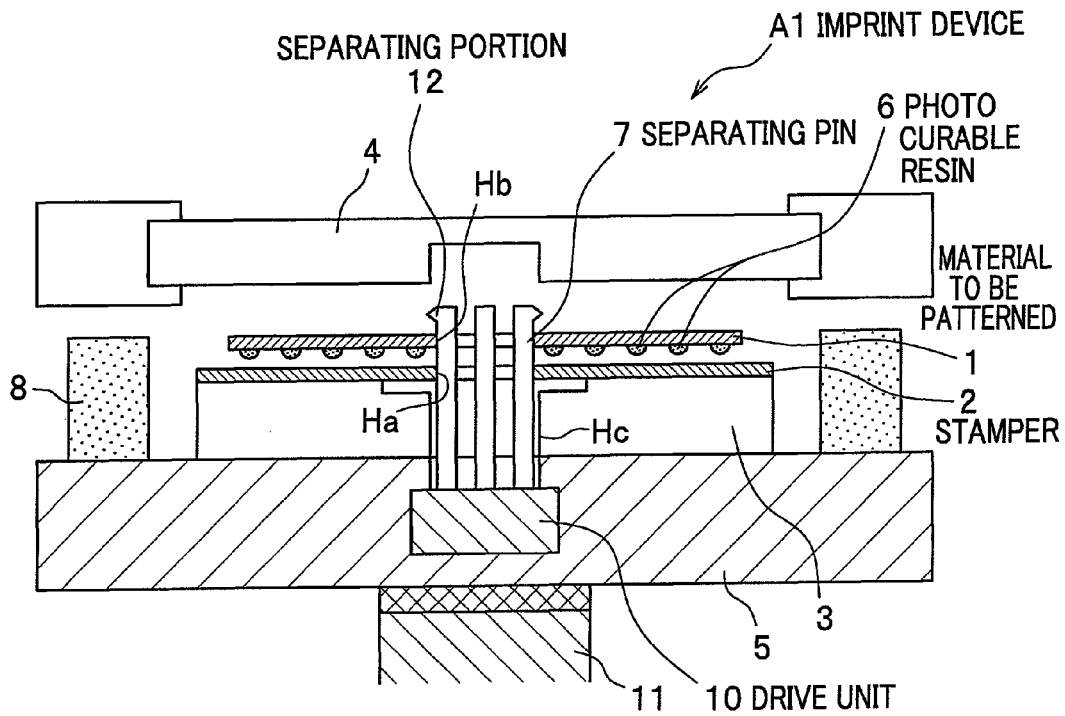
FIG. 1 is a cross sectional block diagram showing an imprint device according to an embodiment of the present invention.

As shown in FIG. 1, an imprint device A1 includes a stamper 2 on a lower plate 3 placed on a movable stage 5. The movable stage 5 is moved up and down by an up-down mechanism 11. After chamfered portions T (see FIG. 3) of the stamper 2 and a material to be patterned 1 are locked by a plurality of separating pins 7, the stamper 2 is separated from the material to be patterned 1, details of which are to be described later. Each end of the separating pins 7 is provided with "one continuous surface" for closely contacting the chamfered portions T. And, in this step, these continuous surfaces of the separating pins 7 hold the stamper 2 together. Alternatively, the separating pins 7 may each have a plurality of surfaces formed on respective separating portions 12b,12c (see FIGS. 5B, 5C, 5E and 5F) to be described later, and the surfaces of each of the separating pins 7 hold the stamper 2 together.

The material to be patterned 1 is provided above the stamper 2. The material to be patterned 1 has photo curable resin 6 on its surface. The material to be patterned 1 also has a through hole at its center. A transparent upper plate 4 is provided above the material to be patterned 1. When the movable stage 5 is lifted up to bring a vacuum seal 8 in contact with the upper plate 4, a vacuum chamber is formed between the movable stage 5 and the upper plate 4. Air is exhausted from the vacuum chamber by a vacuum pump (not shown) so as to expose the material to be patterned 1 and the stamper 2 to a vacuum atmosphere. Thus, an air bubble will not be caught between the material to be patterned 1 and the stamper 2, when the material to be patterned 1 and the stamper 2 come in contact with each other through the photo curable resin 6 in the vacuum atmosphere, details of which are to be described later. The imprint device A1 further includes the separating pins 7, each end of which is provided with the separating portion 12; and a drive unit 10 for driving the separating pins 7. The separating pins 7 including the separating portions 12 and the drive unit 10 hold at least one of the chamfered portions T (see FIG. 3) of at least one of the material to be patterned 1 and the stamper 2, to thereby separate the material to be patterned 1 and the stamper 2. The separating pins 7 including the separating portions 12 and the drive unit 10 may be collectively referred to as "a separating unit". The separating pins 7 may be collectively referred to as a "jig".

The stamper 2 is a disk-shaped member having a through hole Ha at its center. The stamper 2 includes a predetermined substrate, of which a surface opposing the material to be patterned 1 has a microstructure pattern to be transferred to the material to be patterned 1. A method for creating the a microstructure pattern on the surface of the stamper 2 is not specifically limited. The method may be, for example, photolithography, focused ion beam lithography, electron beam writing, and plating. Any material may be used for the stamper 2, as long as the material has intensity and workability at a required level. For example, silicon, glass, nickel and resin may be used. The surface of the stamper 2 may be subjected to treatment with fluorine or silicone so as to be easily separated from the material to be patterned 1 or a material provided thereon. Each of inner and outer edges of the stamper 2 is provided with a pair of chamfered portions T (see FIG. 3), which are to be described later. The chamfered portions each have a width in a range from 0.05 µm to half a thickness of the predetermined substrate.

The material to be patterned 1 is also a disk-shaped member having a through hole Hb at its center. The microstructure pattern created on the stamper 2 are transferred to a surface of the material to be patterned 1. The material to be patterned 1 may have a diameter different from that of the stamper 2. The material to be patterned 1 used in the embodiment has a smaller diameter than that of the stamper 2. The material to be patterned 1 used in the embodiment of the present invention is transparent, because irradiation of electromagnetic waves such as ultraviolet rays has to reach and cure the photo curable resin 6 across the material to be patterned 1. However, instead of the photo curable resin 6, any other material such as thermosetting resin or thermoplastic resin may be used for the material to be patterned 1. In this case, the material to be patterned 1 may not be transparent.

The material to be patterned 1 may include a resin material such as a resin thin film applied on a predetermined substrate, a resin substrate, and a resin sheet. The resin material may be adapted to obtain a desired accuracy in microfabrication on a surface of the substrate. A suitable resin material for the material to be patterned 1 may include, as a principal component, cycloolefin polymers, polymethyl methacrylate, polystyrene, polycarbonate, polyethylene terephthalate, polylactic acid, polypropylene, polyethylene, polyvinyl alcohol, and a synthetic material with a photosensitive material added to any of the above-mentioned resin materials. Materials for the substrate on which the resin thin film or the like is applied may include silicone, glass, quartz, aluminum alloy, and resin, for example. Each of inner and outer edges of the material to be patterned 1 is provided with a pair of chamfered portions T (see FIG. 3), which are to be described later. The chamfered portions T each have a width in a range from 0.05 µm to half a thickness of the above-mentioned substrate.

Materials for the material to be patterned 1 and the stamper 2 may be selected such that a rigidity of the material to be patterned 1 is different from that of the stamper 2. Or, a thickness of the material to be patterned 1 may be suitably adjusted so that the rigidity thereof is different from that of the stamper 2. This facilitates separation between the material to be patterned 1 and the stamper 2. For example, if the separation is performed by bending the material to be patterned 1, the material to be patterned 1 may have a smaller rigidity than the stamper 2. On the contrary, in a case by bending the stamper 2, the material to be patterned 1 may have a larger rigidity than the stamper 2.

In the imprint device A1, the material to be patterned 1 and the stamper 2 are aligned with each other. Then the stamper 2 is pressed onto the material to be patterned 1, to thereby transfer a microstructure pattern on the stamper 2 onto the photo curable resin 6 provided on the material to be patterned

1. After that, ultraviolet rays are irradiated on the photo curable resin 6 across the upper plate 4, thus curing the photo curable resin 6.

Each of the separating pins 7 is a rod-like member having a separating portion 12 at its end. The separating pins 7 are inserted into both a through hole Ha of the stamper 2 and a through hole Hb of the material to be patterned 1. In other words, the separating pins 7 are provided at the end on the through hole Ha side of the stamper 2, and the end on the through hole Hb side of the material to be patterned 1. The drive unit 10 moves the separating pins 7 in a radial direction as well as in a vertical direction with respect to the material to be patterned 1 (or the stamper 2). The separating pins 7 may be provided at an end on an outer circumference side of the material to be patterned 1 (or the stamper 2).

Figure 2:
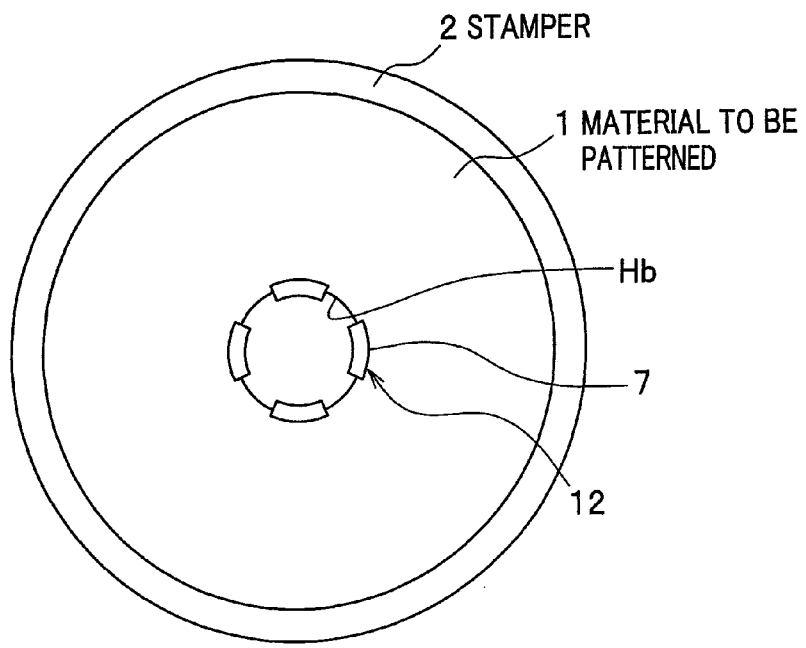
FIG. 2 is a plan view showing a material to be patterned and a stamper in a positional relationship of FIG. 1, of the imprint device according to the embodiment.

The separating pins 7 may be disposed such that stress by the separating pins 7 is equally distributed to the stamper 2 or the material to be patterned 1. Two or more separating pins 7 may be used. The separating pins 7 may be in contact at different positions with the edges of the central through holes Ha, Hb of the stamper 2 and the material to be patterned 1 respectively, or with the edges of respective outer circumferences of the material to be patterned 1 or the stamper 2. Thus the stress by the separating pins 7 is uniformly applied to the stamper 2 or the material to be patterned 1. In this embodiment, as shown in FIG. 2, four separating pins 7 are disposed at an equal distance along a circumferential edge of the through hole Hb of the material to be patterned 1. Also in the embodiment, as shown in FIG. 1, the separating portions 12 are provided at each end of the separating pins 7, and protrude from longitudinal portions of the separating pins 7, in a radial direction from the center of the lower plate 3 toward the outside thereof. A tip end of each separating portion 12 is formed in a sharp wedge shape.

Each of the separating portions 12 (see FIG. 3) has a shape adapted to that of each chamfered portion T at the edge of the stamper 2 and/or the material to be patterned 1. The end of the stamper 2 and/or the material to be patterned 1 may be on the through hole Ha or Hb side, or on the outer circumference (not shown) side. In this embodiment, the separating portions 12 each has a shape adapted to that of the each chamfered portions T of the stamper 2 and the material to be patterned 1, as shown in FIG. 3. Each outer end face of the separating portions 12 is formed in an arc shape in conformity with those of the chamfered portions T of the stamper 2 and the material to be patterned 1.

The separating pins 7 may each have a smaller Young's modulus than those of the stamper 2 and the material to be patterned 1. Materials for the separating pins 7 may be resin or the like so as not to easily scratch or damage the stamper 2 and the material to be patterned 1. Suitable resin materials for the separating pins 7 include, as a principal component, cycloolefin polymers, polymethyl methacrylate, polystyrene, polycarbonate, polyethylene terephthalate, polylactic acid, polypropylene, polyethylene, and polyvinyl alcohol. Any of the separating pins 7 may be conveniently replaced with a new one, when worn out.

Next are described operations performed by the imprint device A1 and the imprint method according to the embodiment with reference to FIG. 4A to FIG. 4D. For simplification, the movable stage 5, the vacuum seal 8, the drive unit 10, the up-down mechanism 11, and the chamfered portions T of the material to be patterned 1 and the stamper 2 are omitted in FIG. 4A to FIG. 4D.

In the imprint device A1, as shown in FIG. 1, the stamper 2 is placed on the lower plate 3. Then the material to be patterned 1 having the photo curable resin 6 on its surface is provided above the stamper 2. The four separating pins 7 are inserted into the central through hole Ha of the stamper 2 and the central through hole Hb of the material to be patterned 1. The drive unit 10 increases distances between the separating pins 7. As a result, the separating pins 7 finally contact with the circumferential edges of the central through holes Ha, Hb of the stamper 2 and the material to be patterned 1, respectively. Thus the separating pins 7 hold the stamper 2 and the material to be patterned 1 with a distance therebetween.

When the up-down mechanism 11 lifts up the movable stage 5, a vacuum chamber is formed surrounded by the movable stage 5, the upper plate 4, and the vacuum seal 8, to thereby seal up the material to be patterned 1 and the stamper 2. Air is exhausted from the vacuum chamber so as to expose the material to be patterned 1 and the stamper 2 to a pressure-reduced atmosphere, while the material to be patterned 1 and the stamper 2 are held with the distance maintained therebetween. This prevents an air bubble left therebetween, thus preventing a possible defect in a microstructure pattern.

Figure 4A:
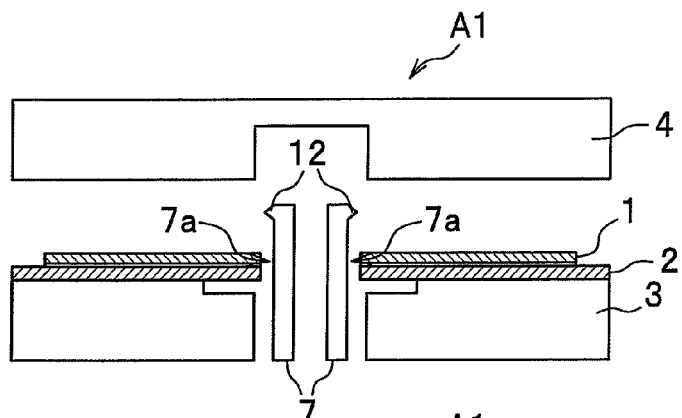
FIG. 4A to FIG. 4D are views for explaining an imprint method according to the embodiment.

In FIG. 4A, the drive unit 10 (see FIG. 1) reduces the distances between the separating pins 7. The separating pins 7 release the material to be patterned 1. The material to be patterned 1 falls down by its own weight. As a result, the material to be patterned 1 comes in contact with the stamper 2 through the photo curable resin 6.

Figure 4B:
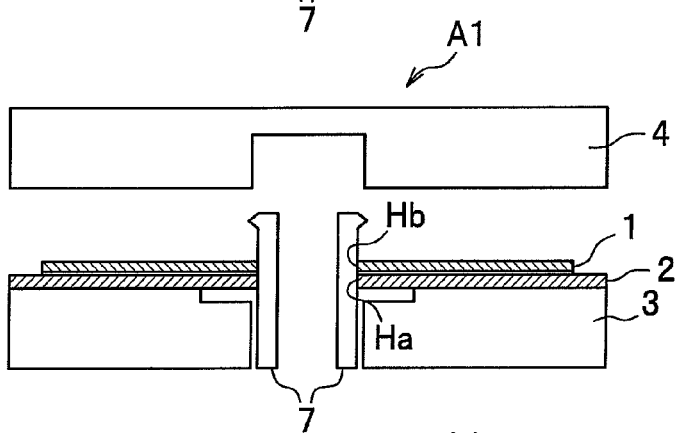

In FIG. 4B, the drive unit 10 (see FIG. 1) again increases the distances between the separating pins 7. The separating pins 7 are thus pressed to the edges of the through holes Ha, Hb of the stamper 2 and the material to be patterned 1, respectively. This enables alignment between the stamper 2 and the material to be patterned 1.

Figure 4C:
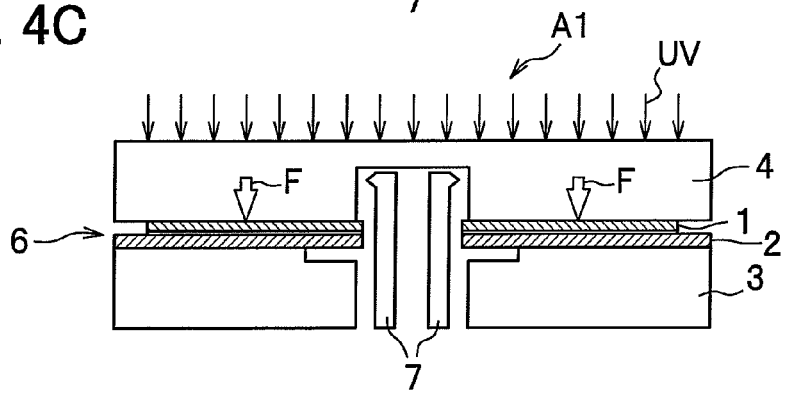

In FIG. 4C, a load F is applied in a direction from the upper plate 4 toward the material to be patterned 1 if necessary. The load F may elastically deform the vacuum seal 8 (see FIG. 1), allowing the lower plate 3 and the upper plate 4 to sandwich, with the load F, the material to be patterned 1 and the stamper 2 which have already been in contact with each other. The microstructure on the stamper 2 is thus transferred onto the photo curable resin 6 on the material to be patterned 1. The load F may be generated mechanically, with fluid pressure of water or gas, or contactlessly with electromagnetic power or the like. According to properties of the photo curable resin 6 or any other materials used, the load F may be a weight of the stamper 2 of its own. In FIG. 2D, a light source (not shown) radiates ultraviolet rays UV onto the photo curable resin 6 through the upper plate 4. The radiation cures the photo curable resin 6, onto which the surface structure on the stamper 2 has been transferred.

Figure 4D:
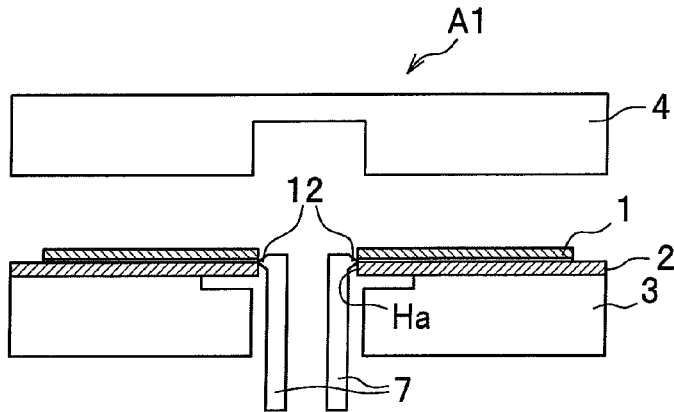

In FIG. 4D, the drive unit 10 (see FIG. 1) moves the separating pins 7 radially outward of the material to be patterned 1 (stamper 2), so that the separating portions 12 of the separating pins 7 come in contact with the chamfered portions T (see FIG. 3) of the material to be patterned 1 and the stamper 2. The separating portions 12 are brought in contact with an interface between the circumferential edge of the central through hole Hb of the stamper 2 and the circumferential edge of the central through hole Ha of the material to be patterned 1. Then the drive unit 10 moves the separating pins 7 downward, to thereby bend and separate the stamper 2 from the material to be patterned 1. In this way, the material to be patterned 1 having thereon the photo curable resin 6 whose surface has the microstructure pattern transferred from the surface of the stamper 2 is obtained.

In the imprint device A1 and the imprint method as described above, the separating pins 7 hold at least one of the chamfered portions T of at least one of the stamper 2 and the material to be patterned 1. Then the stamper 2 and the material to be patterned 1 are separated. This enables the stamper 2 and the material to be patterned 1 to be separated from each other without damaging the transferred microstructure, unlike conventional technologies (see U.S. Pat. No. 6,870,301, for example).

The present invention is not limited to the above-mentioned embodiment, and is carried out in various embodiments.

In the above-mentioned embodiment, one of the chamfered portion T of the stamper 2 is held, so as to separate the stamper 2 and the material to be patterned 1. However, the present invention is not limited to this. One of the chamfered portion T of not the stamper 2 but the material to be patterned 1 may be held. In this case, the material to be patterned 1 may have a lower rigidity than the stamper 2.

In the embodiment, the stamper 2 and the material to be patterned 1 have the central through holes Ha,Hb, respectively. However, the present invention is not limited to this. The stamper 2 and the material to be patterned 1 may not have any central through holes. In this case, the outer circumferential edge of the stamper 2 and/or the material to be patterned 1 may be held, making use of at least one of the chamfered portions T formed on the outer circumferential edge (not shown). After that, the stamper 2 and the material to be patterned 1 are separated. Or, the stamper 2 and the material to be patterned 1 may also be separated, making use of the chamfered portions T provided on inner and outer circumferential edges (not shown) of the stamper 2 and/or the material to be patterned 1.

In the embodiment, the stamper 2 is placed on the lower plate 3. Then the material to be patterned 1 with the photo curable resin 6 applied thereon in advance is provided above the stamper 2, in such a manner that the material to be patterned 1 faces the stamper 2. However, the present invention is not limited to this. The material to be patterned 1 with the photo curable resin 6 applied thereon in advance may be placed on the lower plate 3. Then, the stamper 2 may be provided above the material to be patterned 1 facing thereto. Or, the stamper 2 with the photo curable resin 6 applied thereon in advance may be arranged in the same way. Additionally, the imprint device A1 may incorporate therein a unit such as a dispenser and an inkjet head for applying the photo curable resin 6 to the stamper 2 or the material to be patterned 1. Thus the photo curable resin 6 is automatically applied to the surface of the stamper 2 or the material to be patterned 1.

In the embodiment, the photo curable resin 6 is used for transferring a microstructure on the surface of the stamper 2 to the material to be patterned 1. However, the present invention is not limited to this. A thermoplastic or thermosetting resin material may be used in the present invention. If the thermoplastic resin material is used, the material to be patterned 1 is preheated to a glass transition temperature of the thermoplastic resin material or higher. Then the material to be patterned 1 is pressed onto the stamper 2. After that, the stamper 2 and the material to be patterned 1 are cooled to cure the resin material. In this step, if the thermosetting resin material is used instead, the stamper 2 and the material to be patterned 1 are maintained at a polymerization temperature of the resin material to cure the same. After the resin material is cured, the stamper 2 and the material to be patterned 1 are separated from each other, to thereby obtain the material to be patterned 1 having on its surface, the microstructure transferred from the stamper 2.

In the embodiment, the stamper 2 is held by the lower plate 3 with the vacuum contact or the like. However, the present invention is not limited to this. The stamper 2 may be fixed onto the lower plate 3. In this case, a space adapted to receive tops of the separating pins 7 may be created in the upper plate 4. The space serves for preventing the separating pins 7 from contacting the upper plate 4, when the separating pins 7 are lifted up for separating the material to be patterned 1 from the stamper 2, after the separating pins 7 are brought in contact with at least one of the chamfered portions T of the stamper 2.

In the embodiment, the separating pins 7 are used. However, the present invention is not limited to this. Different types of the separating pins 7 may be used as shown in FIG. 5A to FIG. 5E.

Figure 5A:
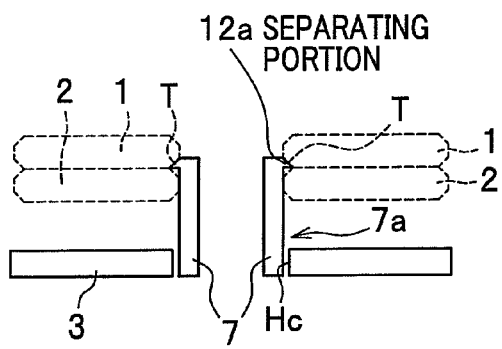
FIG. 5A to FIG. 5F are schematic views showing variations of separating pins.

The separating pins 7 in FIG. 5A each include a separating portion 12a, and an alignment portion 7a including a plane surface substantially perpendicular to the lower plate 3. Such separating pins 7 having the alignment portions 7a are designed to come in contact substantially perpendicular to the edge of the material to be patterned 1 (see FIG. 1) and the edge of the stamper 2 (see FIG. 1) at the respective alignment portions 7a. The separating pins 7 of FIG. 5A thus minimizes a difference in alignment between the material to be patterned 1 and the stamper 2. In addition, when the separating pins 7 move up and down in a direction perpendicular to the lower plate 3, the separating portions 12a of the separating pins 7 come in contact with the chamfered portions T (see FIG. 3) of the material to be patterned 1 and the stamper 2. This allows separation between the material to be patterned 1 and the stamper 2. Similarly, the separating pins 7 shown in FIG. 5B, FIG. 5C and FIG. 5D move up and down in the direction perpendicular to the lower plate 3.

Figure 5D:
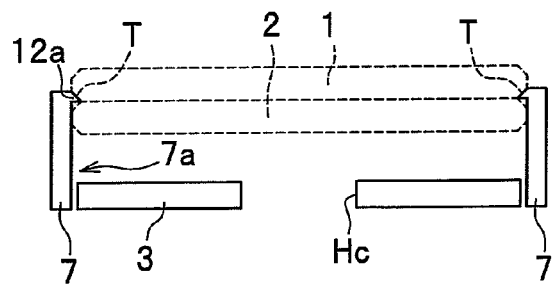
Figure 5B:
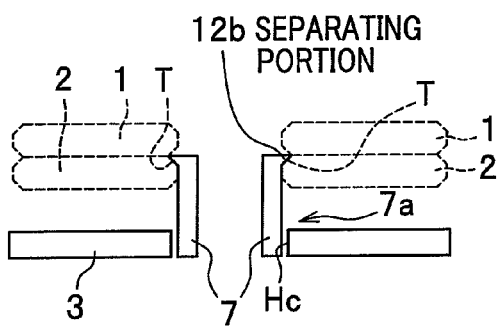
Figure 5E:
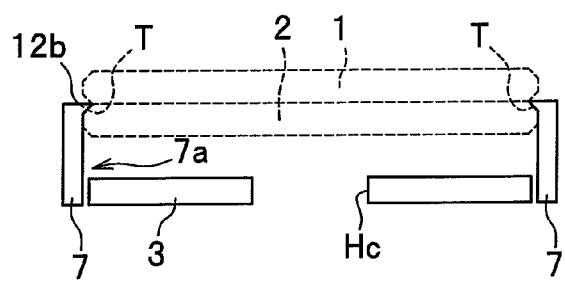
Figure 5C:
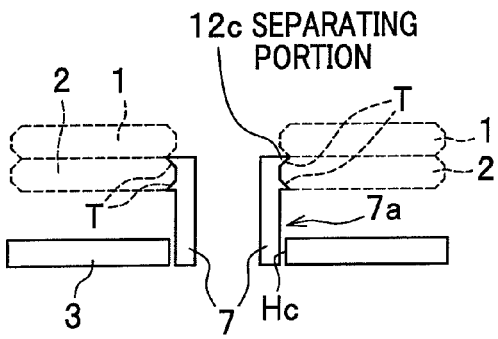
Figure 5F:
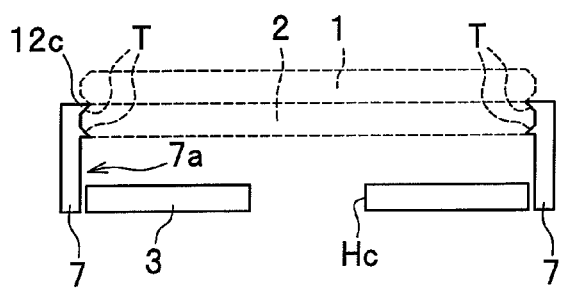

The separating pins 7 each shown in FIG. 5A, FIG. 5B and FIG. 5C are provided on a central through hole side Hc of the lower plate 3. Those separating pins 7 separate the material to be patterned 1 and the stamper 2 at respective edges of the central through hole Hc of the material to be patterned 1 and the stamper 2. Meanwhile, the separating pins 7 each shown in FIG. 5D, FIG. 5E and FIG. 5F are provided on an outer circumference side of the lower plate 3. Those separating pins 7 separate the material to be patterned 1 and the stamper 2 at respective edges of the outer circumference of the material to be patterned 1 and the stamper 2.

A shape of the separating portion 12 of each separating pin 7 may be varied. For example, the separating pins 7 in FIG. 5A, FIG. 5B and FIG. 5E have single wedge-shaped and one-face-tapered separating portions 12a,12b,12b, respectively. Meanwhile, the separating pins 7 in FIG. 5C and FIG. 5F have double wedge-shaped separating portions 12c, 12c, respectively. Namely, the separating portions 12c, 12c have two or more faces to hold the stamper 2 (or the material to be patterned 1).

The separating pins 7 in FIG. 5A to FIG. 5F each include the separating portions 12a, 12b or 12c, and the alignment portion 7a. However, those separating pins 7 may each include only the separating portions 12a, 12b or 12c.

In the embodiment, a surface structure on one unit of the stamper 2 is transferred to the material to be patterned 1. However, a pair of surface structures on a pair of the stampers 2 may be transferred to the material to be patterned 1. FIG. 6A to FIG. 6H referred to herein are views for explaining the imprint method using the imprint device with a pair of the stampers 2a,2b. It is to be noted that the chamfered portions T of the material to be patterned 1 and the stampers 2a,2b are omitted in FIG. 6A to FIG. 6H.

Figure 6A:
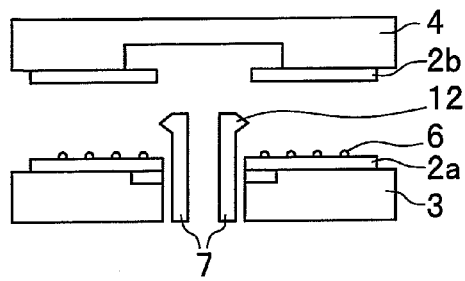
FIG. 6A to FIG. 6H are views for explaining an imprint method using a pair of stampers.

In FIG. 6A, in the imprint device, one stamper (an upper stamper) 2b is fixed to the upper plate 4, and the other stamper (a lower stamper) 2a is placed on the lower plate 3. An acrylate-based photo curable resin 6 is applied on a top surface of the lower stamper 2a. The stamper 2b is made to be more separatable than the stamper 2a from the material to be patterned 1.

Figure 6E:
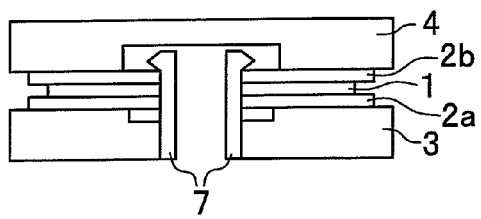
Figure 6B:
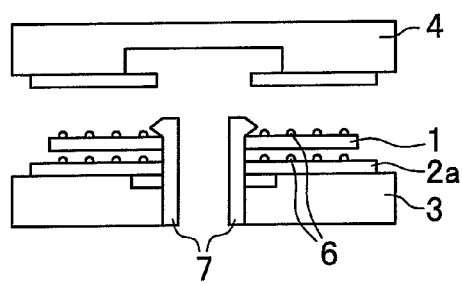

In FIG. 6B, the material to be patterned 1 having one surface with the acrylate-based photo curable resin 6 applied thereto is provided between the pair of the stampers 2a,2b. The stampers 2a,2b have less rigidity than the material to be patterned 1. This facilitates separation of the stampers 2a,2b from the material to be patterned 1, details of which are to be described later. Then the separating pins 7 hold the material to be patterned 1 and the stamper 2a with a distance therebetween.

Figure 6F:
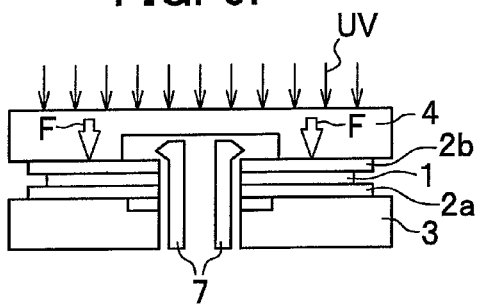
Figure 6C:
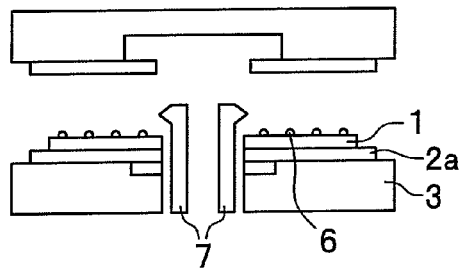
Figure 6G:
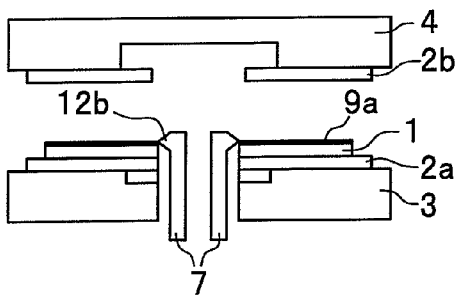
Figure 6D:
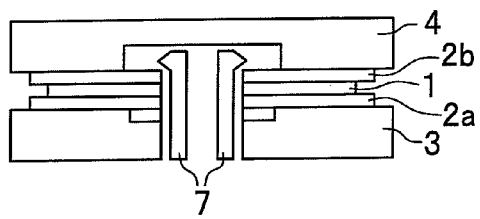

In FIG. 6C, the separating pins 7 release the material to be patterned 1. The material to be patterned 1 falls down to come in contact with the lower stamper 2a through the photo curable resin 6. In FIG. 6D, the stamper 2b fixed to the upper plate 4 is brought down until the material to be patterned 1 and the stampers 2a,2b all come in contact together. As a result, the stamper 2b, photo curable resin 6, material to be patterned 1, photo curable resin 6, and stamper 2a are arranged in this order from above to below, in a position sandwiched between the upper plate 4 and the lower plate 3. In FIG. 6E, the separating pins 7 are pressed to respective ends on central through hole sides of the material to be patterned 1 and the stampers 2a,2b, to thereby align the material to be patterned 1 and the stampers 2a,2b.

In FIG. 6F, the stampers 2a,2b and the material to be patterned 1 are pressed all together with the load F, in the position sandwiched between the upper plate 4 and the lower plate 3. In this state, ultraviolet rays UV are irradiated to the photo curable resin 6.

Figure 6H:
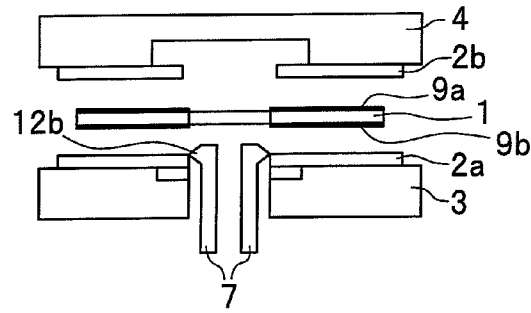

The irradiation cures the photo curable resin 6. After that, the separating portions 12b of respective separating pins 7 are brought in contact with an interface between the upper stamper 2b and the material to be patterned 1. The separating pins 7 are moved upward to lift up the chamfered portion T (see FIG. 3) of the stamper 2b, on the central through hole side of the stamper 2b. This results in separation of the stamper 2b from the material to be patterned 1, as shown in FIG. 6G. As described above, the stamper 2b is made to be more separatable than the stamper 2a from the material to be patterned 1. The stamper 2b is hence separated from the material to be patterned 1 more easily than the stamper 2a is. Subsequently, the separating portions 12b of respective separating pins 7 are brought in contact with an interface between the lower stamper 2a and the material to be patterned 1. Then the separating pins 7 are moved downward to press down the chamfered portion T (see FIG. 3) on the central through hole side of the stamper 2a. This results in separation of the stamper 2a from the material to be patterned 1, as shown in FIG. 6H.

EXAMPLES

More detailed and specific descriptions will be provided on the present invention, by presenting various examples as follows.

Example 1

In Example 1, there was provided a groove structure on one face of a disk substrate.

As for a material to be patterned 1, a glass-disk substrate with a diameter of 65 mm, a thickness of 0.6 mm and a through hole Hb diameter of 20 mm was used. The material to be patterned 1 was prepared such that an end of an outer circumferential thereof and an end of a through hole thereof were chamfered by a width of 0.15 mm, respectively. There was previously provided an acrylate photo curable resin 6 on a face of the material to be patterned 1 in a dispensing method.

As for a stamper 2, a quartz substrate having the same shape as the above-mentioned material to be patterned 1 was used. On a face of the stamper 2 opposing the material to be patterned 1, there were provided a plurality of concentric grooves in a conventional EB (electron beam direct writing) method. Each of the grooves had a width of 50 nm, a depth of 100 nm and a pitch of 100 nm. The central axis of the grooves was agreed with that of the stamper 2.

Next, as shown in FIG. 1, the stamper 2 was placed on the lower plate 3. The material to be patterned 1 was transferred above the stamper 2 from the external by using a robot arm (not shown). The four separating pins 7 were pressed to the end of the through hole Hb of the material to be patterned 1 and the end of the through hole Ha of the stamper 2, so that the material to be patterned 1 and the stamper 2 were held with a distance therebetween by the separating pins 7. At this time, the distance between the stamper 2 and the material to be patterned 1 was 200 µm. A movable stage 5 (see FIG. 1) was lifted by an up-down mechanism 11 (see FIG. 1), so that a vacuum chamber (see FIG. 1) was formed between the upper plate 4 and the movable stage 5.

As a result, a vacuum chamber was formed between the upper plate 4 and the movable stage 5, and the decompressed atmosphere in the vacuum chamber was set to 1.0 kPa.

Next, as shown in FIG. 4A, released from the separating pins 7, the stamper 2 came in contact with the material to be patterned 1 through the photo curable resin 6. As shown in FIG. 4B, the material to be patterned 1 and the stamper 2 were aligned with each other by pressing the separating pins 7 at the ends of the through hole Hb of the material to be patterned 1 and of the through hole Ha of the stamper 2. Then, as shown in FIG. 4C, as the movable stage 5 moves upward, the stamper 2 was pressed with a load F to the material to be patterned 1 between the lower plate 3 and the upper plate 4. While the stamper 2 was pressed, UV light was radiated to the photo curable resin 6. After the photo curable resin 6 became cured, the pressure in the vacuum chamber was returned to the atmospheric pressure, and the movable stage 5 was lowered to the original position by the up-down mechanism 11.

Figure 7:
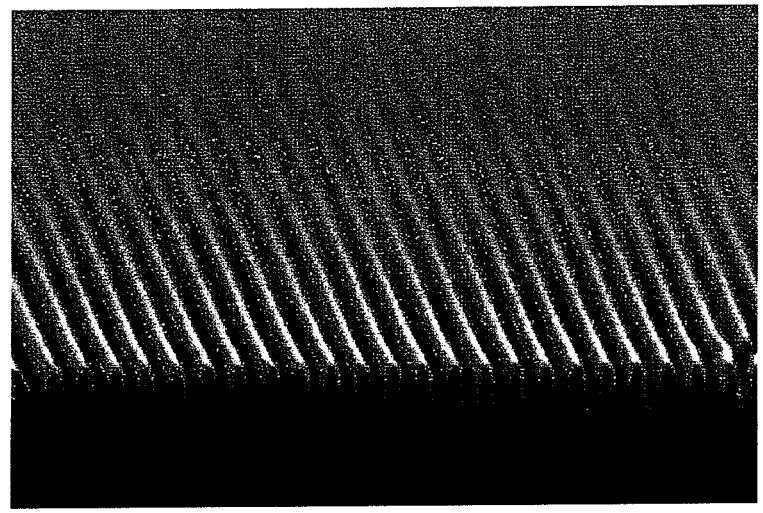
FIG. 7 is an electron microscope image of a groove structure according to a first example.

After that, as shown in FIG. 4D, the drive unit 10 (see FIG. 1) moved the separating pins 7 outwardly in a radial direction of the material to be patterned 1 (the stamper 2), such that the separating portions 12 of the separating pins 7 were inserted in an interface between the material to be patterned 1 and the stamper 2. Then the separating portions 12 came in contact with the chamfered portions T (see FIG. 3) at the end of the central through-hole Ha of the stamper 2 and the end of the central through-hole Hb of the material to be patterned 1. Then the drive unit 10 moved the separating pins 7 downward, thus bending the stamper 2 and separating the same from the material to be patterned 1. It was observed that the photo curable resin 6 had been cured on the material to be patterned 1, and a pattern was transferred on the photo curable resin 6 from the surface structure of the stamper 2. The transferred pattern was constituted of grooves with a width of 50 nm, a depth of 100 nm and a pitch of 100 nm. FIG. 7 shows an electron microscope image of the groove structure.

Example 2

In Example 2, there were provided a column structure on both faces of a disk substrate.

As for a material to be patterned 1, a glass-disk substrate same as that used in the Example 1 was used.

As for a stamper 2, a pair of quartz substrates having the same shape as the material to be patterned 1 were used. On a face of each of the stampers 2a,2b opposing the material to be patterned 1, there were formed plural pits having a diameter of 0.18 μm, a depth of 0.5 μm and a pitch of 360 nm in a conventional photolithography method, and there was also provided on each of the stampers 2a,2b a ring-like line having a ring-diameter of 62 mm, a width of 0.02 mm, and a depth of 0.5 μm. A center of this ring-like line was arranged to be concentric to the central axis of each of the stampers 2a,2b.

As shown in FIG. 6A, one stamper 2b (hereinafter referred to as an upper stamper 2b) was fixed to the upper plate 4. The other stamper 2a (hereinafter referred to as a lower stamper 2a) was fixed to the lower plate 3. The stampers 2a,2b were placed in such a manner that a face having a surface structure of each of the stampers 2a,2b opposes each other. An acrylate photo curable resin 6 was applied on the upper face of the lower stamper 2a.

As shown in FIG. 6B, the material to be patterned 1 having the photo curable resin 6 applied on its one face was provided between the stampers 2a,2b. At this time, the material to be patterned 1 was placed such that the face thereof on which the photo curable resin 6 was applied faced upward. The separating pins 7 were pressed to the ends of the through hole Hb of the material to be patterned 1 and of the through hole Ha of the stamper 2, thereby to hold the material to be patterned 1 and the lower stamper 2 with a distance therebetween. The distance was approximately 200 μm.

The decompressed atmosphere in the vacuum chamber which had been formed between the upper plate 4 and the movable stage (not shown) was set to 1.0 kPa. Then, as shown in FIG. 6C, the separating pins 7 released the material to be patterned 1, thus bringing the material to be patterned 1 in contact with the lower stamper 2 through the photo curable resin 6. As shown in FIG. 6D, the material to be patterned 1 and both the stampers 2a, 2b were in contact with one another through the photo curable resin 6. As shown in FIG. 6E, the separating pins 7 were pressed to the material to be patterned 1 and the stampers 2a,2b, so as to align the material to be patterned 1 and the stampers 2a, 2b all together.

Then, as shown in FIG. 6F, the material to be patterned 1 and the stampers 2a, 2b were pressed all together with the load F between the upper and lower plates 3, 4. In this state, the UV light was radiated.

After the photo curable resin 6 was cured, the separating portions 12b of the separating pins 7 were brought in contact with the chamfered portions T (see FIG. 3) of the upper stamper 2b and the material to be patterned 1. Then the separating pins 7 were moved upward, thus bending a portion nearer to the central through-hole of the stamper 2b. As shown in FIG. 6G, this results in separation of the stamper 2b from the material to be patterned 1, to thereby expose a pattern 9a on a surface on a stamper 2b side of the material to be patterned 1. Subsequently, the separating portions 12b of the separating pins 7 were brought in contact with the chamfered portions T of the lower stamper 2a and the material to be patterned 1. As shown in FIG. 6H, the separating pins 7 were moved downward to separate the stamper 2a from the material to be patterned 1. It is to be noted that, when each of the stampers 2a,2b are separated from the material to be patterned 1, the material to be patterned 1 may be held with a robot arm not shown or the like.

Figure 8:
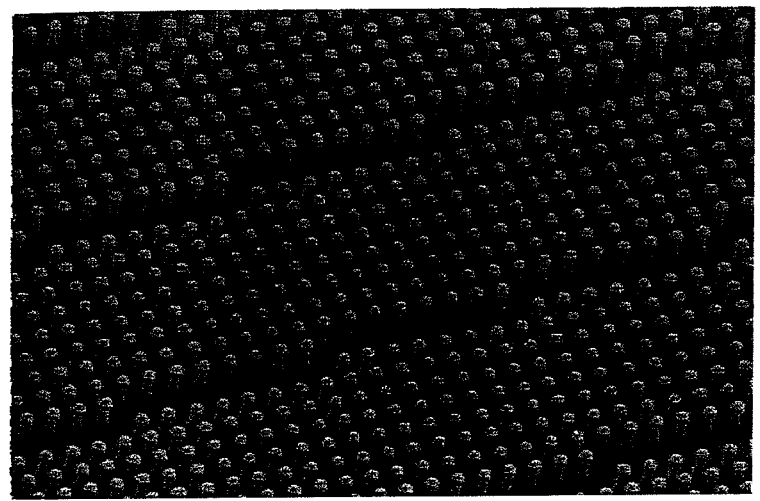
FIG. 8 is an electron microscopic image showing a columnar structure according to a second example.

It was observed that the photo curable resin 6 had been cured on both faces of the material to be patterned 1, and a pattern was transferred on each photo curable resin 6 from the surface structure of each of the stampers 2a,2b. The pattern had a column-like structure, and each column had a diameter of 0.18 μm, a height of 0.5 μm and a pitch of 360 nm. FIG. 8 shows an electron microscope image of the column structure.

Example 3

In Example 3, a method for manufacturing a discrete track medium by using the imprint method of the present invention will be described with reference to the drawings if necessary. Of the drawings to be referred to hereinafter, FIG. 9A to FIG. 9D are views for explaining the method of manufacturing the discrete track medium.

Figure 9A:
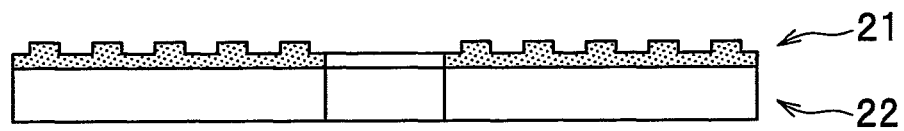
FIG. 9A to FIG. 9D are views for explaining a method of manufacturing a discrete track medium according to a third example.

As shown in FIG. 9A, there was prepared a glass substrate 22 obtained in the Example 1, in which there was provided on the glass substrate 22 a pattern formed layer 21 constituted of a photo curable resin 6, on which a surface structure of the stamper 2 had been transferred.

Figure 9B:
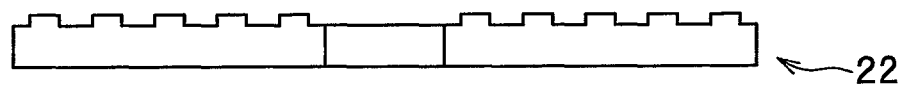

Next, a surface of the glass substrate 22 was processed in a conventional dry etching method, using the pattern formed layer 21 as a mask. As a result, as shown in FIG. 9B, a structure corresponding to the pattern of the pattern formed layer 21 was etched on the surface of the glass substrate 22. In this example, fluorine-containing gas was used for the dry etching. This dry etching may be performed such that, after a thin film part of the pattern formed layer 21 is removed by oxygen plasma etching, the glass substrate 22 exposed is etched with fluorine-containing gas.

Figure 9C:
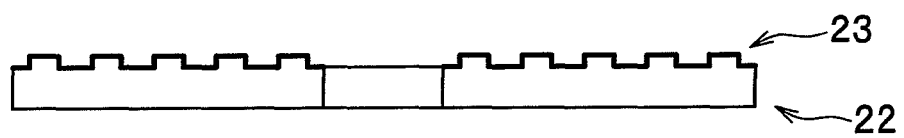

Then, as shown in FIG. 9C, on the glass substrate 22 with the etched structure thereon, there was provided a magnetic recording medium formation layer 23 including a pre-coat layer, a magnetic domain control layer, a soft magnetic underlayer, an intermediate layer, a perpendicular recording layer and a protection layer in a DC magnetron sputtering method (see JP2005-038596A, for example). The magnetic domain control layer includes a non-magnetic layer and an antiferromagnetic layer.

Figure 9D:
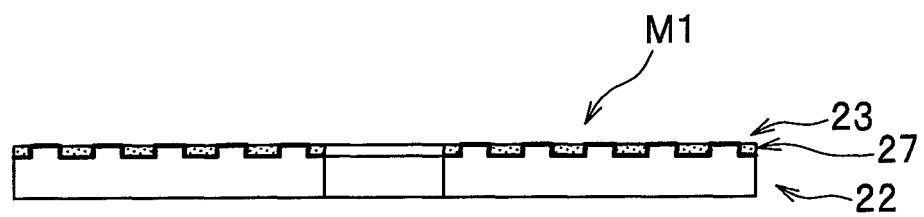

Next, as shown in FIG. 9D, non-magnetic material 27 was applied on the magnetic recording medium formation layer 23, whereby the surface of the glass substrate 22 was smoothed. Accordingly a discrete track medium M1 that was approximately 200 Gbpsi in terms of area density was obtained.

Example 4

Another example of a method for manufacturing a discrete track medium by using the imprint method of the present invention will be described with reference to the drawings if necessary. Of the drawing to be referred to hereinafter, FIG. 10A to FIG. 10E are views for explaining a method of manufacturing the discrete track medium.

Figure 10A:
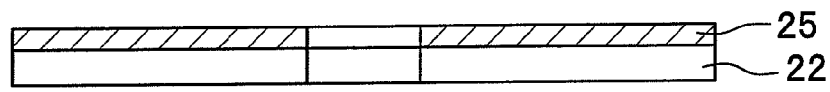
FIG. 10A to FIG. 10E are views for explaining a method of manufacturing a discrete track medium according to a fourth example.
Figure 10B:
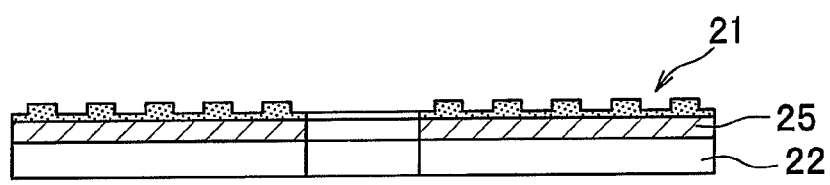

In Example 4, there was prepared a following substrate, instead of using the glass substrate 22 having the pattern formed layer 21 that was obtained in the Example 1. As shown in FIG. 10A, this substrate was formed such that a soft magnetic underlayer 25 was formed on a glass substrate 22. As shown in FIG. 10B, as similar in Example 1, on this substrate, there was provided a pattern formed layer 21 constituted of the photo curable resin 6, on which the surface structure of the stamper 2 had been transferred.

Figure 10C:
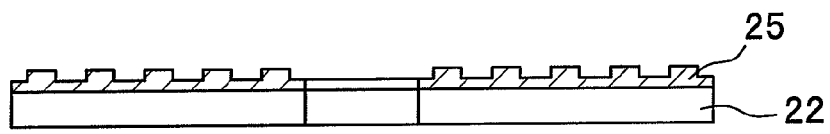

Next, the soft magnetic underlayer 25 was processed in a conventional dry etching method, using the pattern formed layer 21 as a mask. As a result, as shown in FIG. 10C, a structure corresponding to the pattern of the pattern formed layer 21 was etched on the surface of the soft magnetic underlayer 25. In this example, fluorine-containing gas was used for the dry etching.

Figure 10D:
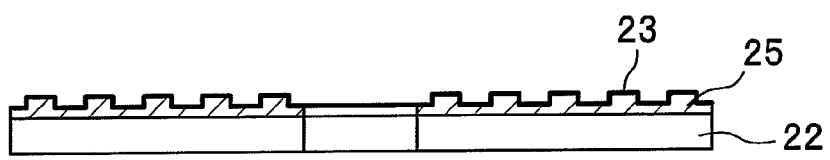
Figure 10E:
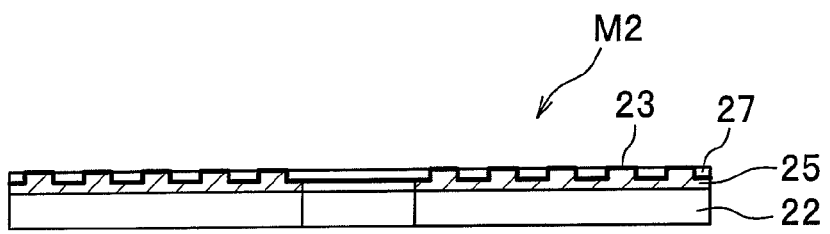

Then, as shown in FIG. 10D, on the surface of the soft magnetic underlayer 25 having the etched structure thereon, there was provided a magnetic recording medium formation layer 23 including a pre-coat layer, a magnetic domain control layer, a soft magnetic underlayer, an intermediate layer, a perpendicular recording layer and a protection layer in a DC magnetron sputtering method (see JP2005-038596A, for example) It should be noted that, in this example, the magnetic domain control layer is constituted of a non-magnetic layer and an antiferromagnetism layer, for example.

Next, as shown in FIG. 1E, the non-magnetic material 27 was applied on the magnetic recording medium formation layer 23, whereby the surface of the soft magnetic underlayer 25 was smoothed. Accordingly, a discrete track medium M2 that was approximately 200 Gpbsi in terms of area density was obtained.

Example 5

A method for manufacturing a disk substrate for a discrete track medium by using the imprint method of the present invention will be described with reference to drawings if necessary. Of the drawings to be referred to hereinafter, FIG. 11A to FIG. 11E are views for explaining a method of manufacturing the disk substrate for the discrete track medium.

Figure 11A:
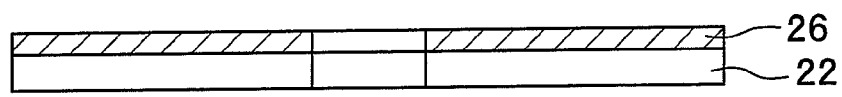
FIG. 11A to FIG. 11E are views for explaining a method of manufacturing a disk substrate for a discrete track medium according to a fifth example.
Figure 11B:
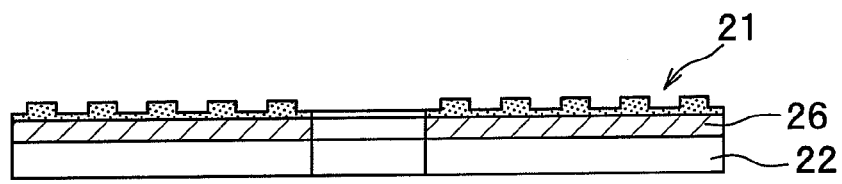

As shown in FIG. 11A, novolak resin was previously applied on the surface of a glass substrate 22 so as to form a flat layer 26. This flat layer 26 may be formed, for example, by using a spin-coating method or a method of pressing the resin with a plate. Next, as shown in FIG. 11B, the pattern formed layer 21 was formed on the flat layer 26. This pattern formed layer 21 was formed by applying a resin containing silicon on the flat layer 26 and using the imprint method of the present invention.

Figure 11C:
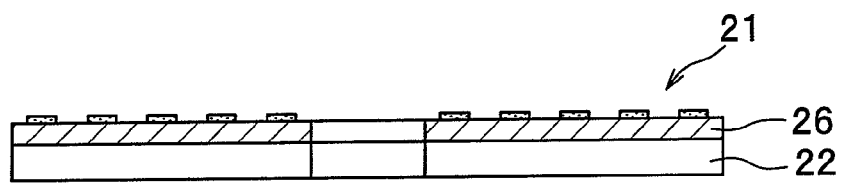
Figure 11D:
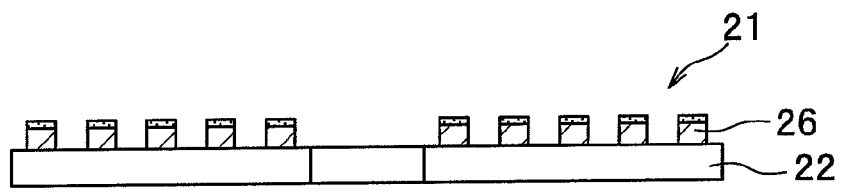
Figure 11E:
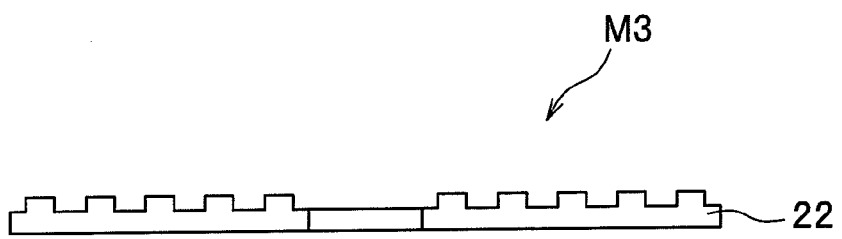

As shown in FIG. 11C, a thin film part of the pattern formed layer 21 was removed in a dry etching method in which fluorine-containing gas was used. Next, as shown in FIG. 11D, the flat layer 26 was removed by an oxygen plasma etching, using the remaining pattern formed layer 21 part as a mask. Then, the surface of the glass substrate 22 was etched by the fluorine-containing gas, and thereafter, the remaining pattern formed layer 21 was removed, so that a disk substrate M3 used for a discrete track medium that was approximately 200 Gbpsi in terms of area density was obtained.

Example 6

Another example of a method for manufacturing a disk substrate for a discrete track medium by using the imprint method of the present invention will be described with reference to the drawings if necessary. Of the drawings to be referred to hereinafter, FIG. 12A to FIG. 12E are views for explaining a method of manufacturing the discrete track medium.

Figure 12A:
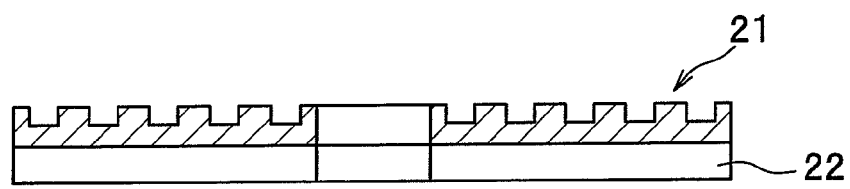
FIG. 12A to FIG. 12E are views for explaining a method of manufacturing a disk substrate for a discrete track medium according to a sixth example.
Figure 12B:
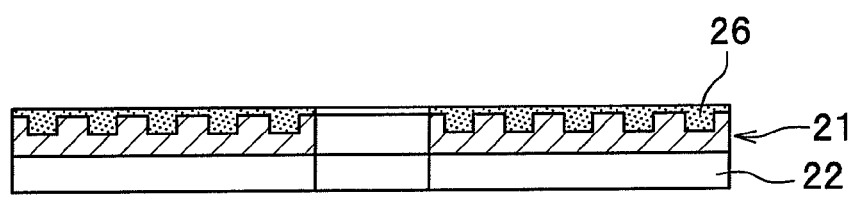
Figure 12C:
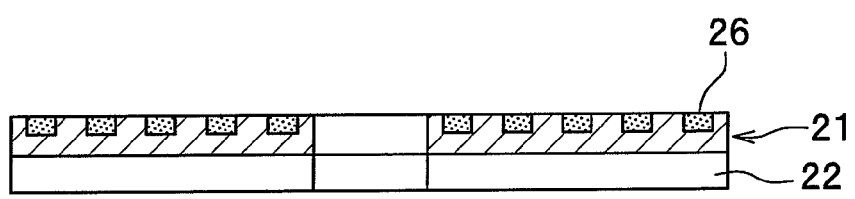
Figure 12D:
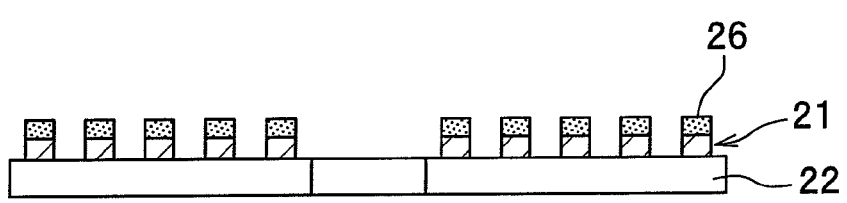
Figure 12E:
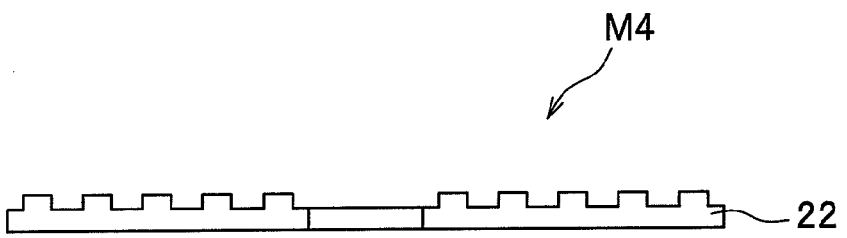

As shown in FIG. 12A, acrylate resin in which photosensitive material was added was applied on a glass substrate 22, and a pattern formed layer 21 was formed on the glass substrate 22 by using the imprint method of the present invention. In Example 6, the pattern formed layer 21 having a pattern reversed to those to be formed was formed on the glass substrate 22. Then, as shown in FIG. 12B, silicon/photosensitive material containing resin was applied on the surface of the pattern formed layer 21, so as to form a flat layer 26. This flat layer 26 may be formed, for example, by using a spin-coating method or a method of pressing the resin with a plate. Then, as shown in FIG. 12C, the surface of the flat layer 26 was etched with a fluorine-containing gas, so that an uppermost face of the pattern formed layer 21 was exposed. Next, as shown in FIG. 12D, the pattern formed layer 21 was removed by an oxygen plasma etching, using the remaining flat layer 26 as a mask, whereby the upper surface of the glass substrate 22 was exposed. Then, the surface of the glass substrate 22 was etched by fluorine-containing gas, after which the remaining pattern formed layer 21 was removed, whereby a disk substrate M4 used for a discrete track medium that was approximately 200 Gbpsi in terms of area density was obtained, as shown in FIG. 12E.

Example 7

In Example 7, descriptions will be provided on an optical information processor that was manufactured by using the imprint method of the present invention.

Figure 13:
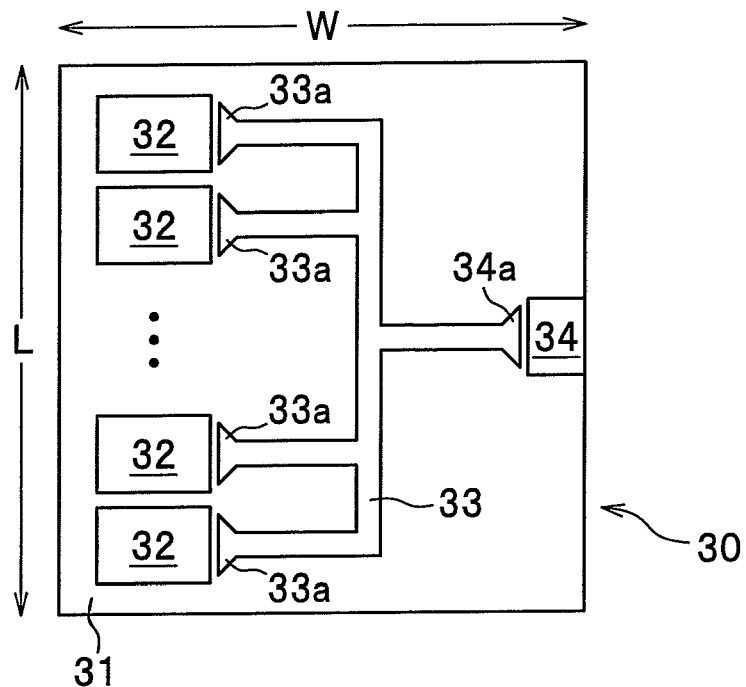
FIG. 13 is a block diagram of an optical circuit as a basic component of an optical device according to a seventh example.
Figure 14:
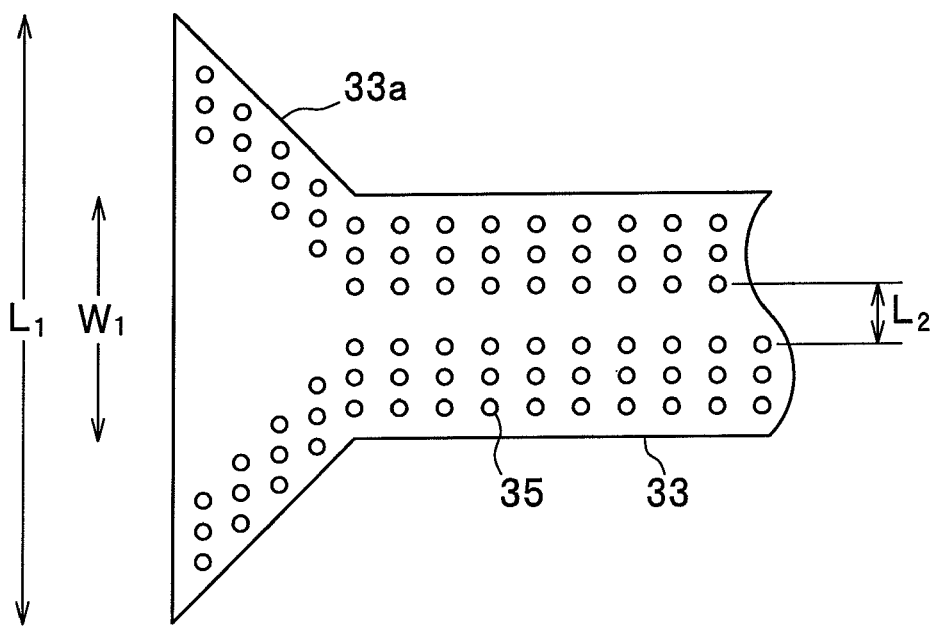
FIG. 14 is a schematic diagram showing a structure of a waveguide of the optical circuit according to the seventh example.

In Example 7, descriptions will be provided on an example in which an optical device that changes a traveling direction of an incident light was applied to an optical information processor used in an optical multiplexing communication system. FIG. 13 is a block diagram of an optical circuit as a basic component of the optical device. FIG. 14 is a schematic diagram showing a structure of a waveguide of the optical circuit.

As shown in FIG. 13, the optical circuit 30 was formed on a substrate 31 of aluminum nitride having a length of 30 mm (L), a width of 5 mm (W) and a thickness of 1 mm. The optical circuit 30 includes plural oscillation units 32 including an indium phosphorus-based semiconductor laser and a drive circuit; optical waveguides 33, 33a; and optical connectors 34, 34a. Each semiconductor laser is defined to have a different oscillation wavelength from one another by 2 to 50 nm.

In the optical circuit 30, an optical signal inputted from each oscillation unit 32 through the waveguides 33 and 33a is transmitted to the connector 34 via the connector 34a. The optical signal from each waveguide 33a is multiplexed at the waveguide 33.

As shown in FIG. 14, plural fine projections 35 are projectedly provided inside the waveguide 33. The waveguide 33a has an input portion in a trumpet-like shape with a width $L_1$ of 20 μm in a sectional plan view, so as to tolerate alignment errors that occur between the oscillation unit 32 and the waveguide 33. In the trumpet-like portion of the waveguide 33a, a group of fine projections 35 are provided to form patters such that an area in absence of the fine projections 35 becomes narrower gradually from a width $W_1$ on the input portion side, and a signal light propagates along the area in absence of the fine projections 35. At a center of a straight portion that forms the waveguide 33, a line of fine projections 35 are removed, so as to provide an area free from a photonic bandgap with a width $L_2$, whereby the optical signal is guided from the trumpet-like area into the area with a width $L_2$ of 1 μm. A pitch between each fine projection 35 is defined to be 0.5 μm. It should be noted that, for simplification, a smaller number of the fine projections 35 than actual ones are illustrated in FIG. 14.

The present invention is applied to the waveguides 33, 33a and the optical connector 34a. Specifically, as described above in details, the imprint method of the present invention is utilized for aligning the substrate 31 and the stamper 2 (see FIG. 1). This imprint method is utilized for forming predetermined fine projections 35 in the predetermined waveguides 33, 33a and the optical connector 34a. The optical connector 34a has a right and left reversed (mirror symmetry) structure of the waveguide 33a of FIG. 14; therefore, alignment of the fine projections 35 in the optical connector 34a is mirror symmetry to that of the fine projections 35 in the waveguide 33a of FIG. 14.

An equivalent diameter (diameter or one side) of the fine projection 35 may be arbitrarily defined in 10 nm to 10 μm, depending on the wavelength of a light source used for a semiconductor laser. The height of the fine projection 35 is preferably defined to 50 nm to 10 μm. A pitch (distance) between each fine projection 35 may be defined to be about half a concerned signal wavelength.

Such an optical circuit 30, which outputs signal lights in different wavelength in a multiplexed manner, can change a light traveling direction, so that a width W of the optical circuit 30 (see FIG. 15) can be significantly reduced to as small as 5 mm. This contributes to a reduction in size of an optical device. In addition, the imprint method of the present invention can form fine projections 35 through a transfer from the surface structure of the stamper 2 (see FIG. 1, etc.), resulting in a reduction in production cost of the optical circuit 30. Example 7 is exemplified to be applied to an optical device that multiplexes input lights. However, the present invention may be utilized in any optical device that controls a light path.

Example 8

Figure 15:
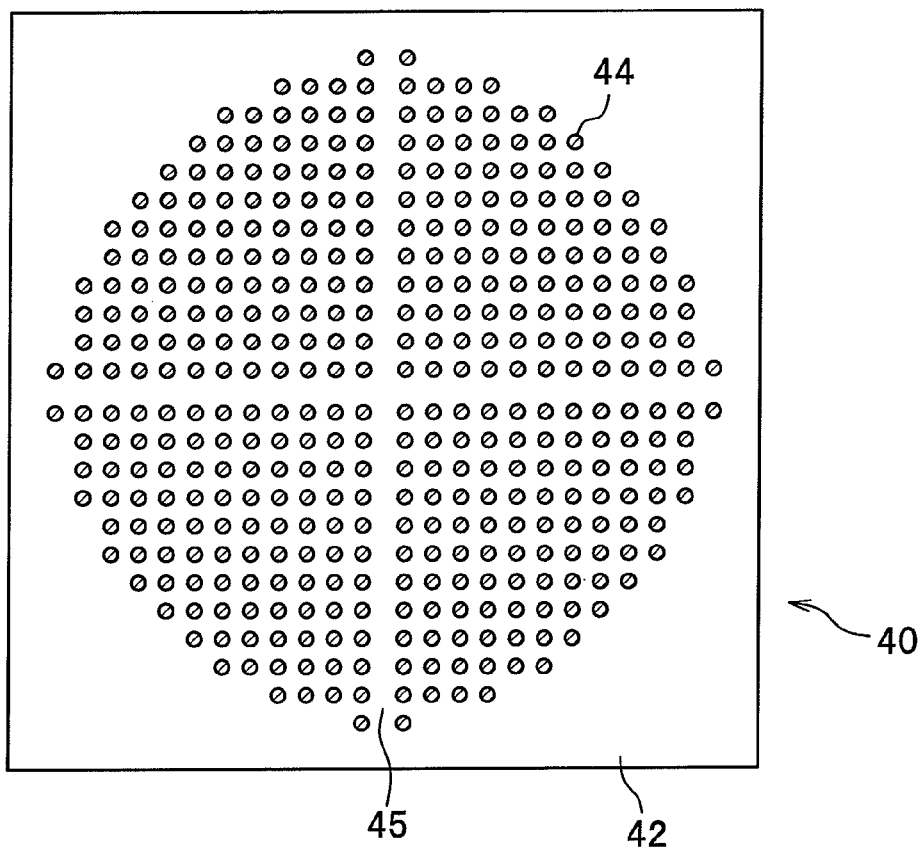
FIG. 15 is a plane view showing a cell culture sheet according to an eighth example.

In Example 8, descriptions will be provided on a biodevice that is produced by using the imprint method of the present invention. FIG. 15 is a plane view of a cell culture sheet.

As shown in FIG. 15, the cell culture sheet 40 includes a thin film (sheet) 42 of PMMA with a thickness of 0.5 μm and fine projections 44 that are mainly composed of PMMA and provided on the thin film 42. The fine projections 44 each have a height of 1 μm and are aligned at a pitch of 1 μm. Each fine projection 44 has a column shape and a diameter of 500 nm. Such a structure as the fine projections 44 are formed on the thin film 42 is realized by using the imprint method of the present invention to press a pattern of the stamper 2 (see FIG. 1) onto a resin layer of PMMA. Alignment between the resin layer of PMMA as the material to be patterned 1 (see FIG. 1) and the stamper 2 is adjusted by using this imprint method of the present invention.

Figure 16:
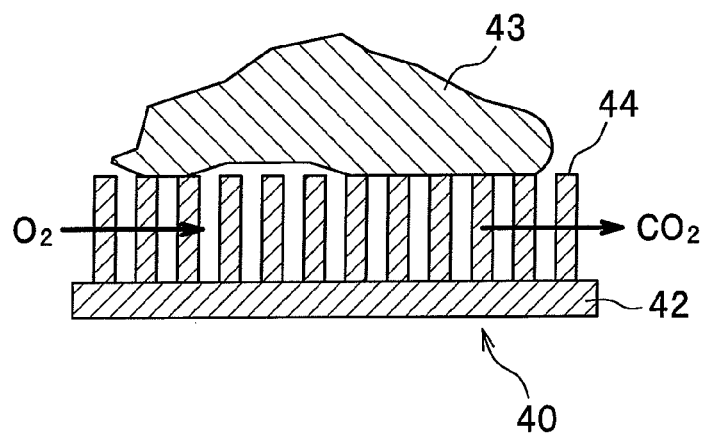
FIG. 16 is a schematic diagram showing an example of cell culture using the cell culture sheet according to the eighth example.

Next, some of the fine projections 44 are removed so as to form a cross-shaped clearance 45. The cell culture sheet 40 is put into a container such as a glass Petri dish, which is soaked in culture fluid. FIG. 16 is a schematic diagram showing an example of cell culture using the cell culture sheet 40. As shown in FIG. 18, the culture fluid 43 containing cells (tissue) of skin, bone or blood, culture medium and nutrient, etc. is put on the cell culture sheet 40 so as to culture the cells.

The cell culture sheet 40 has the cross-shaped clearance 45 (see FIG. 15) that are formed by removing some of the fine projections 44, thereby to allow the culture fluid 43 to easily move along the clearance 45, so that the nutrient is efficiently supplied for the cells to be cultured; at the same time, waste products of the cells in the cell culture process are efficiently drained.

With such a cell culture sheet 40, it is possible to significantly reduce damages to cells, which may be caused in a cell culture using a glass Petri dish when cells are collected from the dish; resulting in enhancement of colonization in cell transplantation. As shown in FIG. 16, the clearance 45 (see FIG. 15) is formed by absence of the fine projections 44 on the cell culture sheet 40, on which the sheet-like epidermal cells are cultured. Since this clearance 45 is provided below the sheet-like epidermal cells, the culture fluid 43 is smoothly supplied for the entire cells to be cultured. Accordingly, efficient supply of nutrients and efficient drains of waste products can be obtained, thereby to reduce destruction of cells under cultivation, which has been a conventional disadvantage.

Next, one specific example of the cell culture sheet 40 according to the imprint method of this example will be described below. While the cell culture sheet 40 produced by using the imprint method of this example was placed in a Petri dish in such a manner that the sheet 40 was soaked in culture fluid, normal human epidermal keratinocytes were cultured on the cell culture sheet 40. For this cultivation, HuMedia-KB2 manufactured by KURABO INDUSTRIES LTD. was used as a culture medium, and the cultivation temperature was 37° C. and the cultivation was carried out in a flow of $CO_2$ of 5%. As a result, epidermal keratinocytes were securely attached on the cell culture sheet 40, and were normally cultured in a sheet-like manner. The cells cultured in a sheet shape were collected on Day 14 after the start of the culture, so that sheet shaped epidermal keratinocytes with less damages were obtained.

As the fine projections 44, material of hydrophilic property that is formed of plasma-processed macromolecule may be used. The material of macromolecule is not limited to a specific one, and it is preferable to select material having smaller influence on cells (tissues) to be cultured, more preferable to use polystyrene, PMMA, polylactic acid or the like.

As for a biodevice, the imprint method of the present invention may be applied to medical/diagnostic tools, specifically called as μTAS, in which a fine structure is fabricated on a surface thereof; or to detection/synthesis means for a medical/chemical purpose.

Example 9

In Example 9, descriptions will be given on a method of producing a multilayer interconnection substrate by using the imprint method of the present invention. FIG. 17A to FIG. 17L are views for explaining a method of manufacturing this multilayer interconnection substrate.

As shown in FIG. 17A, after a resist 52 is formed on a surface of the multilayer interconnection substrate 61 including a silicon oxide film 62 and copper interconnections 61, a pattern transfer is performed by using a stamper not shown. Prior to performing the pattern transfer, the stamper not shown is aligned with the substrate, and then a desired interconnection pattern is transferred onto a desired position on the substrate.

An exposure area 53 of the multilayer interconnection substrate 61 is dry-etched by $CF_4/H_2$ gas, so as to form grooves in the exposure area 53 on the surface of the multilayer interconnection substrate 61, as shown in FIG. 17B. Next, the resist 52 is resist-etched by using RIE. The resist-etching process is performed until the resist 52 portion at a lower step is removed, whereby the exposure area 53 of the multilayer interconnection substrate 61 becomes enlarged around the remaining resist 52, as shown in FIG. 17C. From this stage, a dry-etching operation is further performed on the exposure area 53, whereby the grooves already formed in the exposure area 53 at the previous step are further processed to reach the copper interconnections 63.

Next, the remaining resist 52 is removed so as to obtain the multilayer interconnection substrate 61 having a groove structure on the surface thereof, as shown in FIG. 17E. After a metal film (not shown) is formed on the surface of the multilayer interconnection substrate 61, a metal-plated film 64 is further formed on the substrate thereof by electrochemical plating, as shown in FIG. 17F. Thereafter, the metal-plated film 64 is polished until the silicon oxide film 62 of the multilayer interconnection substrate 61 is exposed. Accordingly, as shown in FIG. 17G, the multilayer interconnection substrate 61 having metal interconnections of the metal-plated film 64 on the surface thereof is obtained.

Now, another process of producing the multilayer interconnection substrate 61 will be described.

The exposure area 53 at the stage of FIG. 17A is further processed by the dry-etching until the etching reaches the copper interconnections 63 inside the multilayer interconnection substrate 61. Then, the resist 52 is etched by using RIE so as to remove the resist 52 portion at a lower step, as shown in FIG. 17I, and thereafter, the metal film 65 is formed on the surface of the multilayer interconnection substrate 61 by using spattering, as shown in FIG. 17J. After the remaining resist 52 is removed in a lift-off process, the metal film 65 partially remains on the surface of the multilayer interconnection substrate 61, as shown in FIG. 17K. Then, the partially remaining metal film 65 is electroless-plated. Accordingly, the multilayer interconnection substrate 61 is obtained as shown in FIG. 17L, in which metal interconnections of the metal-plated film 64 is provided on the surface thereof. As described above, the present invention can be applied to such a multilayer interconnection substrate 61 so as to provide metal interconnections in high accuracy.

The embodiments according to the present invention have been explained as aforementioned. However, the embodiments of the present invention are not limited to those explanations, and those skilled in the art ascertain the essential characteristics of the present invention and can make the various modifications and variations to the present invention to adapt it to various usages and conditions without departing from the spirit and scope of the claims.

The invention claimed is:

1. An imprint device for transferring a finely patterned structure created on a stamper onto a material to be patterned by bringing the stamper and the material to be patterned in contact with each other, the imprint device comprising:
 a separating unit configured to contact at least one of the stamper and the material to be patterned, and to separate the stamper from the material to be patterned,
 wherein the separating unit is configured to contact at least one chamfered edge portion, and to separate the stamper from the material to be patterned, said at least one chamfered edge portion being formed on at least one of the stamper and the material to be patterned; and
 wherein the separating unit includes a plurality of separating pins, wherein each of the separating pins is positioned perpendicular to the stamper, each of the separating pins including a tip which is provided with a separating portion for contacting the chamfered edge portion, said separating unit further including a drive unit configured to drive the separating pins inward and outward in an in-plane direction of the stamper and the material to be patterned to: (1) hold the material to be patterned above and separated from the stamper when the separating pins are driven outward; (2) drop the material to be patterned onto the stamper when the separating pins are driven inward; and (3) bring the separating portions of the tips of the separating pins into contact with the chamfered edge portion when the separating pins are driven outward again, and further configured to drive the separating portions in a layer direction, perpendicular to the in-plane direction, to separate the stamper from the material to be patterned.

2. The imprint device according to claim 1, wherein the stamper is comprised of a material having a rigidity that is different from the rigidity of the material to be patterned.

3. The imprint device according to claim 1, wherein each of the stamper and the material to be patterned includes a central through hole therein.

4. The imprint device according to claim 1, wherein the separating portion is configured to lock an edge of an outer circumference of at least one of the stamper and the material to be patterned.

5. The imprint device according to claim 3, wherein the separating portion is configured to lock an edge of the central through hole of at least one of the stamper and the material to be patterned.

6. The imprint device according to claim 1, wherein the separating portion includes a plurality of surfaces for holding the edge of at least one of the stamper and the material to be patterned.

7. The imprint device according to claim 1, wherein the stamper is formed to be larger than the material to be patterned.

8. The imprint device according to claim 1, wherein a pair of the stampers are disposed to sandwich the material to be patterned to transfer finely patterned structures onto the material to be patterned.

9. The imprint device according to claim 8, wherein one of the pair of the stampers is formed to be more separatable from the material to be patterned than the other one of the pair of stampers.

10. The imprint device according to claim 1, wherein the stamper is fixed, and the at least one chamfered edge portion of the material to be patterned is contacted by the separating portions of the separating pins, under control of the drive unit, so as to separate the material to be patterned from the stamper after the finely patterned structure from the stamper is transferred onto the material to be patterned.

11. An imprint apparatus for transferring a pattern onto a material to be patterned, the imprint apparatus comprising:
 an upper plate;
 a lower plate arranged in parallel to the upper plate;
 a stamper mounted on the lower plate, via a through hole;
 a material to be patterned disposed between the stamper and the upper plate, via a through hole;
 a movable mechanism arranged to move the lower plate relative to the upper plate so as to press the stamper against the material to be patterned and transfer a pattern formed on the stamper onto the material to be patterned,
 a separating unit including a plurality of separating pins inserted in and disposed along a circumferential edge of the through holes of the stamper and the material to be patterned, and driven to align the material to be patterned with the stamper prior to the stamper being pressed against the material to be patterned for transferring a pattern formed on the stamper onto the material to be patterned, and
 wherein the plurality of separating pins each includes a wedge shaped tip adapted to contact chamfered edges of at least one of the stamper and the material to be patterned, each of the separating pins positioned perpendicular to the stamper, and
 wherein said separating unit further includes a drive unit configured to drive the separating pins in an in-plane direction of the stamper and the material to be patterned to bring the tips of the separating pins into contact with the chamfered edge portion, and further configured to drive the separating pins in a layer direction, perpendicular to the in-plane direction, to separate the stamper from the material to be patterned.

12. The imprint apparatus according to claim 11, wherein the stamper is made of a material having a rigidity that is different from the rigidity of the material to be patterned.

13. The imprint apparatus according to claim 11, wherein the plurality of separating pins are disposed at an equal distance along the circumferential edge of the through holes of the material to be patterned.

14. The imprint device according to claim 1, wherein the separating pins are formed along a circumferential direction of the chamfered edge portion and are arranged to hold the chamfered edge portion at respective positions different from each other.

15. The imprint device according to claim 11, wherein the separating portions are formed along a circumferential direction of the chamfered edge portion and are arranged to hold the chamfered edge portion at respective positions different from each other.

16. An imprint apparatus for transferring a pattern onto a material to be patterned, the imprint apparatus comprising:
    an upper plate;
    a lower plate arranged in parallel to the upper plate;
    a stamper mounted on the lower plate, via a through hole;
    a material to be patterned disposed between the stamper and the upper plate, via a through hole;
    a movable mechanism arranged to move the lower plate relative to the upper plate so as to press the stamper against the material to be patterned and transfer a pattern formed on the stamper onto the material to be patterned,
    a separating unit including a plurality of separating pins inserted in and disposed along a circumferential edge of the through holes of the stamper and the material to be patterned, wherein each of the separating pins includes a first portion configured to be driven to align the material to be patterned with the stamper prior to the stamper being pressed against the material to be patterned for transferring a pattern formed on the stamper onto the material to be patterned, and
    wherein the plurality of separating pins each includes a wedge shaped tip, separate from the first portion, adapted to contact chamfered edges of at least one of the stamper and the material to be patterned, each of the separating pins positioned perpendicular to the stamper, and
    wherein said separating unit further includes a drive unit configured to drive the separating pins in an in-plane direction of the stamper and the material to be patterned to bring the tips of the separating pins into contact with the chamfered edge portion, and further configured to drive the separating pins in a layer direction, perpendicular to the in-plane direction, to separate the stamper from the material to be patterned.

17. The imprint apparatus according to claim 16, wherein the stamper is made of a material having a rigidity that is different from the rigidity of the material to be patterned.

18. The imprint apparatus according to claim 16, wherein the plurality of separating pins are disposed at an equal distance along the circumferential edge of the through holes of the material to be patterned.

19. The imprint device according to claim 1, wherein the separating portions are formed along a circumferential direction of the chamfered edge portion and are arranged to hold the chamfered edge portion at respective positions different from each other.

20. The imprint device according to claim 1, wherein said separating pins are further configured to be driven in the layer direction, prior to the stamper being pressed against the material to be patterned to:
    (1) hold the material to be patterned above and separated from the stamper; and
    (2) drop the material to be patterned onto the stamper.

21. The imprint device according to claim 16, wherein said separating pins are further configured to be driven in the layer direction, prior to the stamper being pressed against the material to be patterned to:
    (1) hold the material to be patterned above and separated from the stamper; and
    (2) drop the material to be patterned onto the stamper.

* * * * *